US009196365B2

(12) United States Patent
Park (10) Patent No.: US 9,196,365 B2
(45) Date of Patent: Nov. 24, 2015

(54) SEMICONDUCTOR MEMORY DEVICE AND OPERATING METHOD THEREOF

(71) Applicant: SK hynix Inc., Icheon-si Gyeonggi-do (KR)

(72) Inventor: Kyoung Jin Park, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/283,324

(22) Filed: May 21, 2014

(65) Prior Publication Data

US 2015/0179266 A1    Jun. 25, 2015

(30) Foreign Application Priority Data

Dec. 19, 2013    (KR) .......................... 10-2013-0159384

(51) Int. Cl.
  *G11C 16/10*    (2006.01)
  *G11C 7/14*    (2006.01)
  *G11C 16/04*    (2006.01)

(52) U.S. Cl.
  CPC ............ *G11C 16/10* (2013.01); *G11C 16/0483* (2013.01); *G11C 7/14* (2013.01)

(58) Field of Classification Search
  CPC ............... G11C 16/04; G11C 16/0408; G11C 16/0483; G11C 16/06; G11C 16/10; G11C 16/12; G11C 16/28; G11C 16/3427; G11C 11/419; G11C 11/4099; G11C 11/5628; G11C 2213/71
  See application file for complete search history.

(56) References Cited

U.S. PATENT DOCUMENTS 7,957,191 B2 *   6/2011   Chung ..................... 365/185.13
8,422,299 B2 *   4/2013   Iguchi et al. ............ 365/185.18
2010/0074016 A1   3/2010   Higashitani
2011/0305088 A1 * 12/2011   Huang et al. ............ 365/185.15

FOREIGN PATENT DOCUMENTS

KR          100960466 B1      5/2010

* cited by examiner

*Primary Examiner* — Hoai V Ho
*Assistant Examiner* — Roberto Mancera
(74) *Attorney, Agent, or Firm* — William Park & Associates Ltd.

(57) ABSTRACT

A semiconductor memory device and an operating method thereof are set forth. The semiconductor memory device includes a memory cell array with a string. The string comprises a first dummy memory cell and a second dummy memory cell. A circuit is configured to provide a program voltage and one or more operation voltages to the string during a program operation. Control logic is configured to control the circuit to increase a first threshold voltage of the first dummy memory cell and to increase a second threshold voltage of the second dummy memory cell. The first threshold voltage and a second threshold voltage increase by a hot carrier injection mechanism.

17 Claims, 7 Drawing Sheets

SEMICONDUCTOR MEMORY DEVICE AND OPERATING METHOD THEREOF

CROSS-REFERENCE TO RELATED APPLICATION

The present application claims priority to Korean patent application number 10-2013-0159384 filed on Dec. 19, 2013, in the Korean Intellectual Property Office, the entire disclosure of which is incorporated by reference herein.

TECHNICAL FIELD

Embodiments relate to an electronic device, and more particularly, to a semiconductor memory device and an operating method thereof.

BACKGROUND

Semiconductor memory devices often include memory devices fabricated with semiconductor materials such as, for example, silicon (Si), germanium (Ge), gallium arsenide (GaAs), indium phosphide (InP). Such semiconductor memory devices may be further classified into volatile memory devices and nonvolatile memory devices.

The volatile memory devices include memory devices that are designed to lose internally stored data upon a power supply interruption. The volatile memory devices may include, for example, a static random access memory (SRAM), a dynamic RAM (DRAM), and a synchronous DRAM (SDRAM). In contrast, the nonvolatile memory devices include memory devices that retain stored data even upon experiencing a power supply interruption. The nonvolatile memory devices may include, for example, a read only memory (ROM), a programmable ROM (PROM), an erasable programmable ROM (EPROM), an electrically erasable programmable ROM (EEPROM), a flash memory, a phase-change RAM (PRAM), a magnetic RAM (MRAM), a resistive RAM (RRAM), and a ferroelectric RAM (FRAM). Both of the volatile and non-volatile flash memory devices as discussed here may be further classified into a NOR type and a NAND type.

Additionally, the flash memory devices may be further classified into 2-dimensional semiconductor devices having strings that are horizontally formed on a semiconductor substrate and 3-dimensional semiconductor devices having strings that are vertically formed on a semiconductor substrate.

Such 3-dimensional semiconductor devices as described here have been designed to address limitations generally involving a degree of integration of the 2-dimensional semiconductor devices by vertically forming a plurality of strings on a substrate. The strings may include, for example, a drain select transistor, memory cells, and a source select transistor, which may be connected in series between a bit line and a source line.

SUMMARY

In an embodiment, a semiconductor memory device is set forth. The semiconductor memory device comprises a memory cell array including a string. The string comprises a first dummy memory cell and a second dummy memory cell; a circuit configured to provide a program voltage and one or more operation voltages to the string during a program operation. The string comprises control logic configured to control the circuit to increase a first threshold voltage of the first dummy memory cell and to increase a second threshold voltage of the second dummy memory cell. The first threshold voltage and a second threshold voltage increase by a hot carrier injection mechanism.

In an embodiment, a semiconductor memory device is set forth. The semiconductor memory device comprises a memory cell array including a string comprising a drain select transistor, a plurality of drain side dummy memory cells, a plurality of memory cells, a plurality of source side dummy memory cells, and a source select transistor. The semiconductor memory device comprises a circuit that applies an operation voltage to the string to increase a first threshold voltage and a second threshold voltage of one or more of the plurality of drain side dummy memory cells and one or more of the plurality of source side dummy memory cells. The circuit programs a selected memory cell from among the plurality of memory cells.

In an embodiment, a method for operating a semiconductor memory device is set forth. The method comprises precharging channels of a string. The string comprises a drain select transistor, a source select transistor, a first drain side dummy memory cell, a second drain side dummy memory cell, a first source side dummy memory cell, a first source side dummy memory cell, and a plurality of memory cells. The semiconductor memory device comprises a string. The method comprises applying a turn-off voltage to a first drain side dummy memory cell and to a first source side dummy memory cell; and generating a gate-induced drain leakage. The method comprises applying a pass voltage to a second drain side dummy memory cell while the first drain side dummy memory cell is in a turn-off state and to a second source side dummy memory cell while the first source side dummy memory cell is in the turn-off state. The method comprises increasing threshold voltages of the second drain side dummy memory cell and the second source side dummy memory cell; and applying a program voltage to a selected memory cell from among the plurality of memory cells.

DETAILED DESCRIPTION

Various examples directed to a semiconductor memory device and an operating method thereof will be described below with reference to the accompanying drawings. The inventive concepts set forth below may, however, be embodied in different forms and should thus not be construed as limited to only the examples set forth herein. Rather, these examples are provided to convey the inventive concept to those skilled in the art.

Throughout the specification, when an element is referred to as "connected" to another element, "connected" includes that the element can be "directly connected" to another element or "indirectly connected" to another element with other intervening element(s). Throughout the specification, when a part "includes" a component,"includes" is meant non-exclusively.

Figure 1:
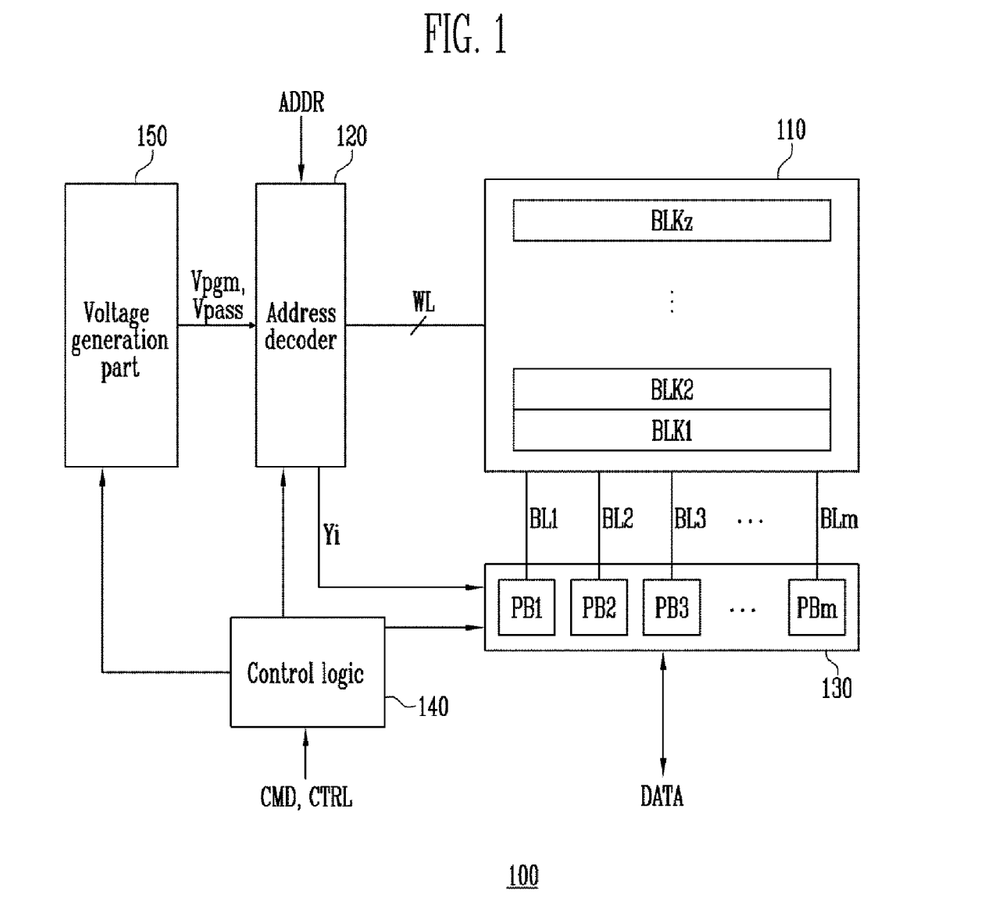
FIG. 1 is a block diagram of a semiconductor memory device.

As shown in the example of FIG. 1, a semiconductor memory device 100 includes a memory cell array 110, an address decoder 120, a read and write circuit 130, a control logic 140, and a voltage generation part 150.

The memory cell array 110 includes a plurality of memory blocks BLK1 to BLKz. The plurality of memory blocks BLK1 to BLKz are connected to the address decoder 120 through the word lines WL. The plurality of memory blocks BLK1 to BLKz connect to the read and write circuit 130 through the bit lines BL1 to BLm. A memory block from the plurality of memory blocks BLK1 to BLKz may includes a plurality of memory cells. In an example, the plurality of memory cells may be nonvolatile memory cells. One or more memory cells connected to the same word line from among the plurality of memory cells may be defined as one page. For example, as shown in FIG. 1, the memory cell array 110 is constituted of a plurality of pages.

A memory block from the plurality of memory blocks BLK1 to BLKz of the memory cell array 110 includes a plurality of strings. A string from the plurality of strings may include, for example, a drain select transistor, a plurality of first dummy memory cells, a plurality of memory cells, a plurality of second dummy memory cells, and a source select transistor, which connect in series between the bit line and a source line.

The address decoder 120, the read and write circuit 130, and the voltage generation part 150 operate as circuits, for example, peripheral circuits, that drive the memory cell array 110.

The address decoder 120 connects to the memory cell array 110 through the word lines WL. The address decoder 120 may operate to respond to a control signal of the control logic 140. The address decoder 120 receives an address ADDR through an input-output buffer (not shown in FIG. 1) in the semiconductor memory device 100.

The address decoder 120 decodes a row address from the received address ADDR and applies, for example, a program voltage (Vpgm), a pass voltage (Vpass), and operation voltages which are generated in the voltage generation part 150 to the memory cells, the drain and source select transistors, and the first and second dummy memory cells of the memory cell array 110 according to the decoded row address when a program operation is performed.

The address decoder 120 may decode a column address from the received address ADDR. The address decoder 120 transmits a decoded column address Yi to the read and write circuit 130.

A program operation of the semiconductor memory device 100 is performed in units of pages. The address ADDR, received when read and program operations are requested, may include, for example, a block address, a row address, and a column address. The address decoder 120 selects one memory block and one word line according to the block address and the row address. The column address is decoded by the address decoder 120 and provided to the read and write circuit 130.

The address decoder 120 may include, for example, a block decoder, a row decoder, a column decode, an address buffer.

The read and write circuit 130 includes a plurality of page buffers PB1 to PBm. The plurality of page buffers PB1 to PBm are connected to the memory cell array 110 through the bit lines BL1 to BLm. One or more page buffers of the page buffers PB1 to PBm may receive and temporarily store program data, and control an electric potential of a corresponding bit line according to the program data using either a program allow voltage or a program prohibition voltage when the program operation is performed. One or more page buffers of the page buffers PB1 to PBm may sense a program state of a corresponding memory cell when a program verify operation is performed, compare to the program data which is temporarily stored when a program operation is performed, and verify if a program of the corresponding memory cell is finished.

The read and write circuit 130 operates to respond to a control signal of the control logic 140.

In an example, the read and write circuit 130 may include, for example, page buffers (or page registers), and a column select circuit.

The control logic 140 is connected to the address decoder 120, the read and write circuit 130, and the voltage generation part 150. The control logic 140 receives a command CMD through the input-output buffer (not shown in FIG. 1) of the semiconductor memory device 100. The control logic 140 may control an overall operation of the semiconductor memory device 100 to respond to the command CMD. The control logic 140 controls the peripheral circuits to increase threshold voltages of the first and second dummy memory cells prior to applying the program voltage Vpgm to a selected memory cell from the memory cells of the memory cell array 110 when a program operation is performed.

The voltage generation part 150 generates the program voltage Vpgm, the pass voltage Vpass, and the plurality of operation voltages according to the control of the control logic 140.

Figure 2:
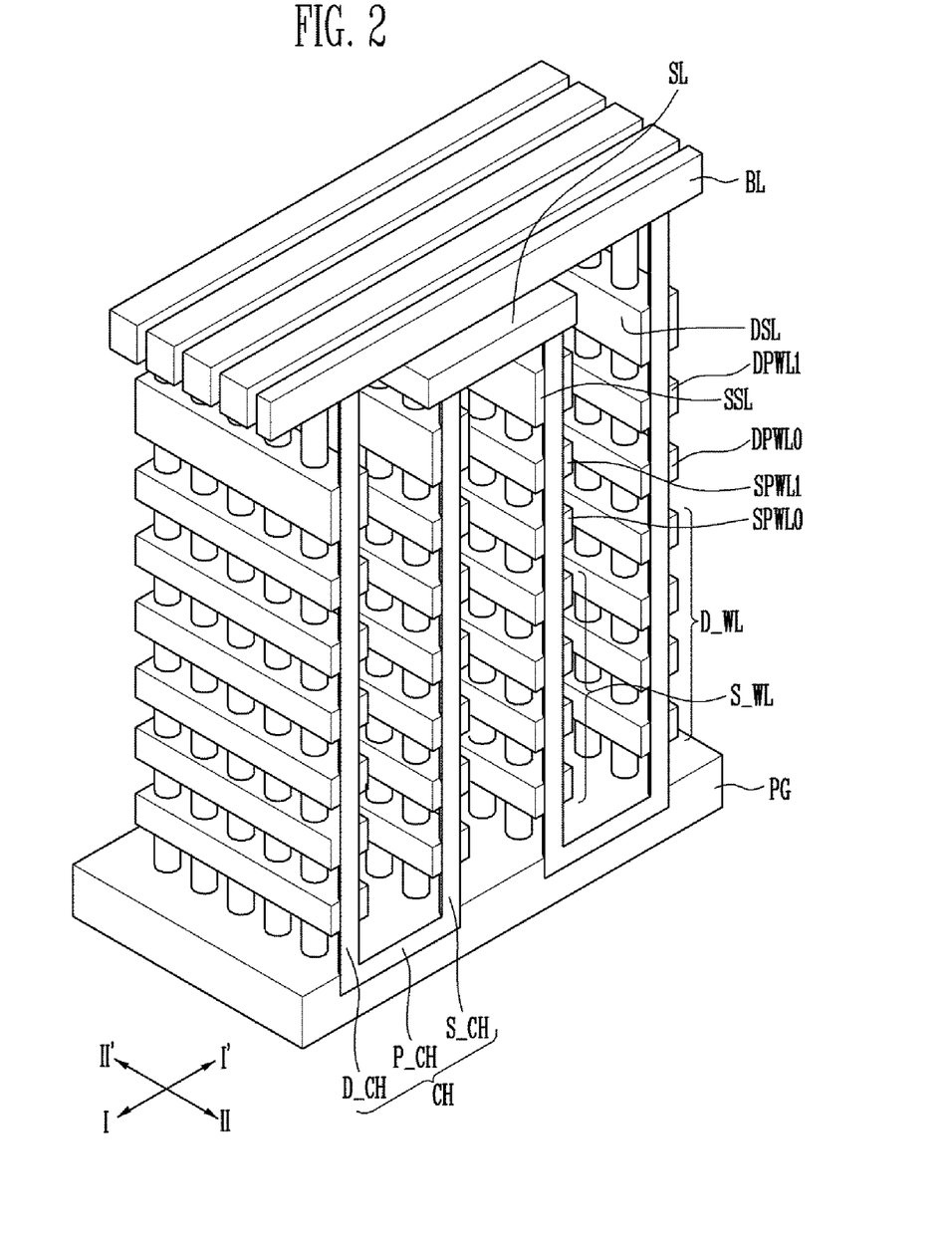
FIG. 2 is a perspective view of a memory cell array of a semiconductor memory device.

As shown in FIG. 2, a semiconductor memory device includes curved, such as, for example U-shaped channel layers CH that may be arranged in a first direction I-I' and a second direction II-II' that crosses the first direction I-I'. The U-shaped channel layer CH includes a pipe channel layer P_CH formed in a pipe gate PG and a pair of source side channel layers S_CH and drain side channel layer D_CH connected to the pipe channel layer P_CH.

The semiconductor memory device includes source side word line layers S_WL that may be stacked along and/or, for example, against the source side channel layer S_CH on the pipe gate PG. Also, the drain side word line layers D_WL may be stacked along and/or, for example, against the drain side channel layer D_CH on the pipe gate PG. A source select line layer SSL is stacked on and/or, for example, against the source side word line layers S_WL. Also, a drain select line layer DSL is stacked on and/or, for example, against the drain side word line layers D_WL. As shown in FIG. 2, drain side dummy word line layers DPWL1 and DPWL0 are stacked between the drain side word line layers D_WL and the drain select line layer DSL. Also, source side dummy word line layers SPWL1 and SPWL0 are stacked between the source side word line layers S_WL and the source select line layer SSL.

As shown in FIG. 2, memory cells are stacked along and/or, for example, against the curved, for example, U-shaped channel layer CH, a drain select transistor and a source select transistor. A drain select transistor and a source select transistor are provided at the ends of the U-shaped channel layer CH. Drain side dummy memory cells are formed between the memory cells and the drain select transistor. Source side dummy memory cells are formed between the memory cells and the source select transistor. Accordingly, strings may be arranged in a U-shape as shown in FIG. 2. The pipe gate PG disposed at and/or, for example, near the bottom of the strings in a U-shape. Additionally, the pipe gate PG is disposed in an intermediate position of memory cells MC and may operate as a pipe transistor.

The semiconductor memory device has bit line layers BL connected to the drain side channel layer D_CH and extending in the first direction I-I', and a source line layer SL connected to the source side channel layer S_CH and extending in the second direction 'II-II'.

Figure 3:
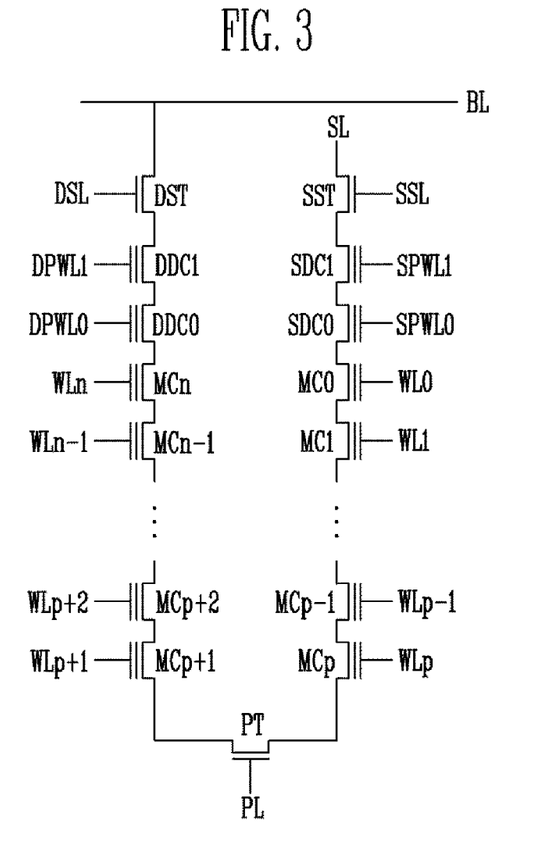
FIG. 3 is a circuit diagram of a string of a semiconductor memory device.

Referring to FIG. 3, a string includes a drain select transistor DST, first and second drain side dummy memory cells DDC0 and DDC1, memory cells MC0 to MCn, first and second source side dummy memory cells SDC0 and SDC1, and a source select transistor SST, which connect in series between a bit line BL and a source line SL. The string may further include a pipe transistor PT connected between a memory cell MCp+1 and a memory cell MCp.

A gate of the drain select transistor DST is connected to a drain select line DSL. Also, a gate of the source select transistor SST is connected to a source select line SSL. Gates of the first and second drain side dummy memory cells DDC0 and DDC1 are connected to first and second drain side dummy word lines DPWL0 and DPWL1. Also, gates of the first and second source side dummy memory cells SDC0 and SDC1 are connected to first and second source side dummy word lines SPWL0 and SPWL1. Gates of the plurality of memory cells MC0 to MCn are connected to a plurality of word lines WL0 to WLn, respectively, and a gate of the pipe transistor PT is connected to a pipe line PL.

Figure 4:
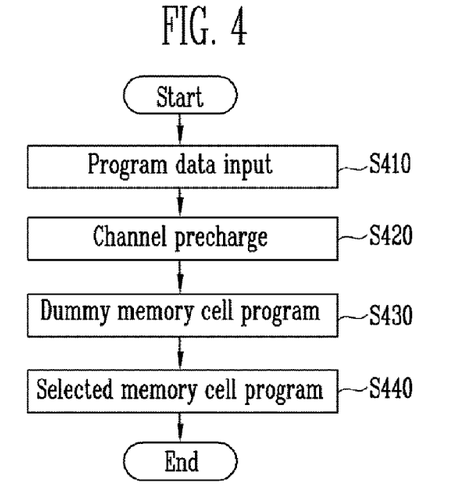
FIG. 4 is a flowchart of a program operation of a semiconductor memory device.

FIG. 4 is a flowchart for describing a program operation of a semiconductor memory device according to the present invention.

Figure 5:
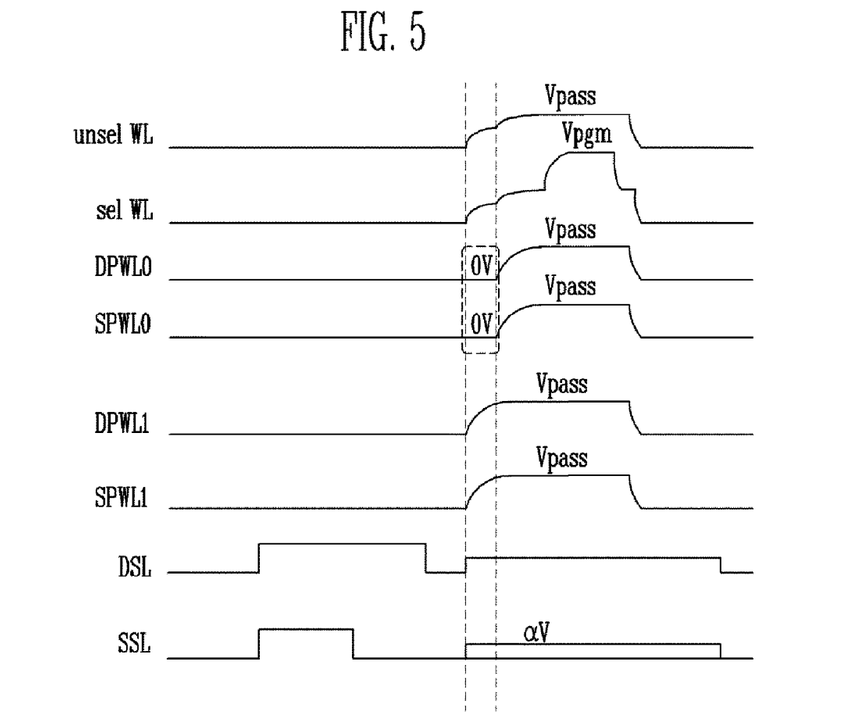
FIG. 5 is a waveform diagram of signals of a program operation of a semiconductor memory device.

FIG. 5 is a waveform diagram of signals for describing a program operation of a semiconductor memory device according to the present invention.

Figure 6:
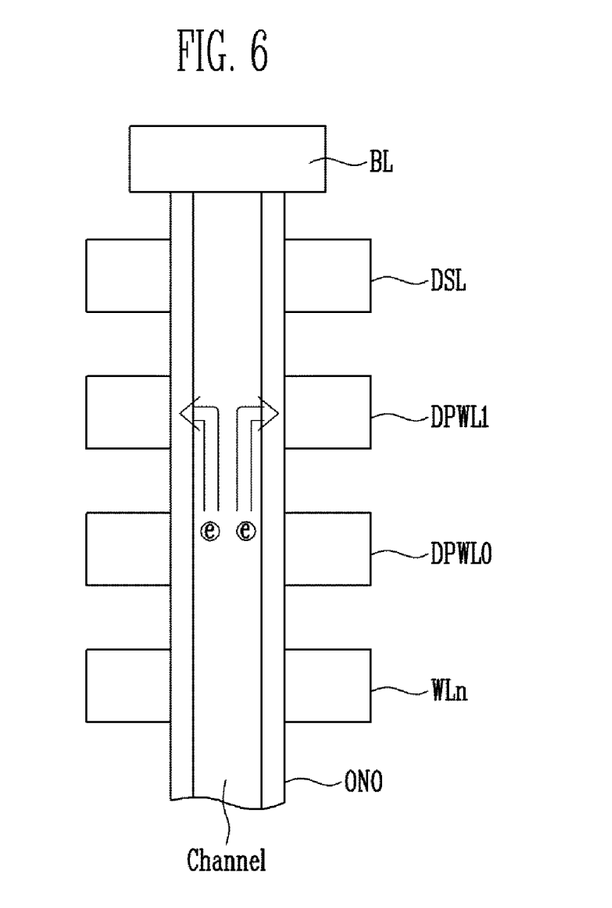
FIG. 6 is a cross-sectional view of a channel of threshold voltages of dummy memory cells that increase during a program operation of a semiconductor memory device.

FIG. 6 is a cross-sectional view of a channel for describing that threshold voltages of dummy memory cells increase during a program operation of a semiconductor memory device according to the present invention.

The program operation of the semiconductor memory device according to the present invention is described below with reference to FIGS. 1 to 6.

1) Input Program Data (S410)

When program data and an address ADDR are received from the external device, the address decoder 120 decodes a column address from the received address ADDR. The address decoder 120 transmits the decoded column address Yi to the read and write circuit 130. The read and write circuit 130 stores the program data, for example, temporarily, in response to the decoded column address Yi in the page buffers PB1 to PBm.

Precharge Channel (S420)

The read and write circuit 130 precharges a set voltage to the bit lines BL1 to BLm of the memory cell array 110. Operation voltages generated at the voltage generation part 150 are applied to the drain select line DSL and the source select line SSL of the memory cell array 110 by the address decoder 120. After a predetermined period of time, the operation voltages applied to the drain select line DSL and the source select line SSL are turned off. In such an instance, the operation voltages applied to the drain select line DSL may be turned off at a later point in time than the operation voltage applied to the source select line SSL.

3) Program Dummy Memory Cell (S430)

The voltage generation part 150 generates a pass voltage Vpass, a first operation voltage that has a lower electric potential level than the pass voltage Vpass, and a second operation voltage of 0 V according to the control of the control logic 140. The address decoder 120 applies the pass voltage Vpass to the second drain side dummy word line DPWL1 and the second source side dummy word line SPWL1. The address decoder 120 applies the second operation voltage to the first drain side dummy word line DPWL0 and the first source side dummy word line SPWL0. In addition, the first operation voltage is applied to the plurality of word lines WL0 to WLn.

The second operation voltage of 0 V is applied to the first drain side dummy memory cell DDC0 and the first source side dummy memory cell SDC0 adjacent to the memory cell MC0 and the memory cell MCn disposed at the outermost of the memory cells. The pass voltage Vpass is applied to the second drain side dummy memory cell DDC1, the second source side dummy memory cell SDC1 adjacent to the drain select transistor DST, and the source select transistor SST. Here, the pass voltage Vpass may have, for example, an electric potential level of 9 V.

In addition, the first operation voltage which has a lower electric potential level than the pass voltage Vpass is applied to the plurality of memory cells MC0 to MCn. For example, an operation voltage of 5 V may be applied.

As a result, the first drain side dummy memory cell DDC0 and the first source side dummy memory cell SDC0, which are in a turn-off state, have a stronger electric field in a drain portion, such that a leakage current flows between a drain and a bulk by a hole of an electron hole pair (EHP) located in a drain region. The leakage current flow from the drain to the bulk through the hole of an EHP may permit a gate-induced drain leakage (GIDL) to occur. An electron (ⓔ) produced by the leakage current flow may move to the second drain side dummy memory cell DDC1, and the second source side dummy memory cell SDC1. In such a case, the pass voltage Vpass, having a higher electric potential level than the first operation voltage, is applied to the word lines WL0 to WLn that are connected to the memory cells MC0 to MCn. The ⓔ thus may flow into charge storage layers ONO of the second drain side dummy memory cell DDC1 and the second source side dummy memory cell SDC1. In detail, the (ⓔ) and a carrier generated by the GIDL flow into the charge storage layer ONO of the second drain side dummy memory cell DDC1 and the second source side dummy memory cell SDC1. The flow may be by, for example, a hot carrier injection mode and/or mechanism, and threshold voltages of the second drain side dummy memory cell DDC1 and the second source side dummy memory cell SDC1 may increase. Therefore, as the threshold voltages of the second drain side dummy memory cell DDC1 and the second source side dummy memory cell SDC1 increase, the leakage current characteristics may be improved. Here, an operation voltage αV is applied to the source select line SSL to improve boosting efficiency through the source line SL and the source select transistor SST may be partly turned on.

4) Program Selected Memory Cell (S440)

The voltage generation part 150 generates the program voltage Vpgm and the pass voltage Vpass according to the control of the control logic 140.

The address decoder 120 decodes a row address among the received address ADDR, the program voltage Vpgm generated in the voltage generation part 150 is applied to a selected word line sel WL among the plurality of word lines WL, and the pass voltage Vpass is applied to unselected word lines unsel WL according to the decoded row address when a program operation is performed.

In an embodiment, before the program voltage Vpgm is applied to selected memory cells by increasing the threshold voltages of the drain side dummy memory cell and the source side dummy memory cell adjacent to the drain select transistor and the source select transistor through the hot carrier injection mode, the leakage current characteristics of the selected transistor are improved so that a program disturbance phenomenon may be improved. Also, for example, before a is applied when a program operation of an incremental step pulse program (ISPP) mode is performed, which a plurality of increasing by a step voltage during a program operation are used, the threshold voltages of the drain side dummy memory cell and the source side dummy memory cell may be increased through the hot carrier injection mode, and the leakage current characteristics are further improved.

Figure 7:
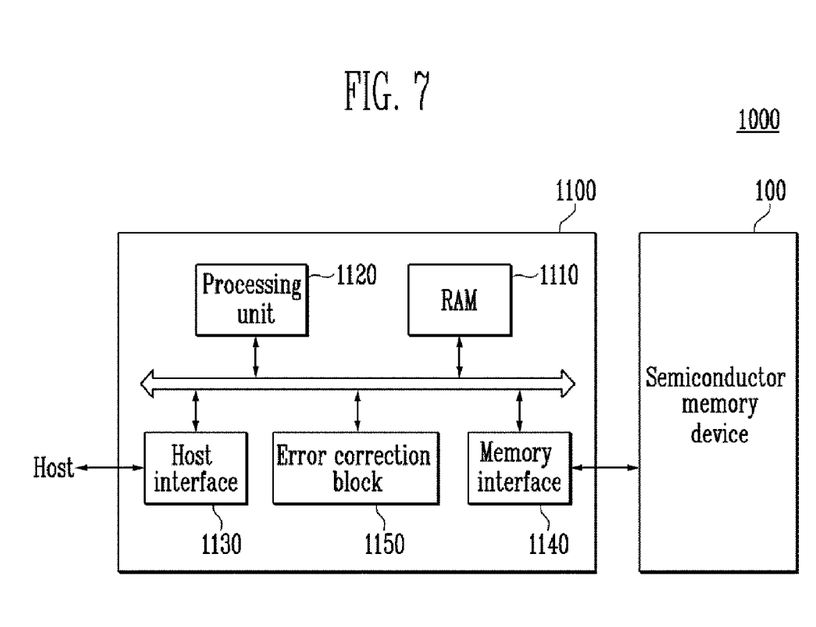
FIG. 7 is a block diagram of a memory system including the semiconductor memory device shown in FIG. 1.

As shown in the example of FIG. 7, a memory system 1000 includes the semiconductor memory device 100 and a controller 1200. The semiconductor memory device 100 is configured and operates in the same manner as described with reference to semiconductor memory device 100 of FIG. 1. Thus, the description thereof will not be repeated herein.

The controller 1100 is connected to a host Host and the semiconductor memory device 100. The controller 1100 is configured to access the semiconductor memory device 100 in response to a request from the Host. For example, the controller 1100 is configured to control read, write, erase, and background operations of the semiconductor memory device 100. The controller 1100 is configured to provide an interface between the semiconductor memory device 100 and the Host. The controller 1100 is configured to drive firmware in order to control the semiconductor memory device 100.

The controller 1100 includes random access memory (RAM) also known as buffer memory 1110, a processing unit also known as a CPU 1120, a host interface 1130, a memory interface 1140, and an error correction block also known as error correction coding (ECC) 1150. The buffer memory 1110 may be used as, for example, at least one of an operation memory of the processing unit 1120, a cache memory between the semiconductor memory device 100 and the Host, and a buffer memory between the semiconductor memory device 100 and the Host. The CPU 1120 controls an overall operation of the controller 1100. The controller 1100 may store temporarily program data provided from the Host when a write operation is performed.

The host interface 1130 includes a protocol to exchange data between the Host and the controller 1100. For example, the controller 1100 may be configured to communicate with the Host through at least one of various interface protocols such as a Universal Serial Bus (USB) protocol, a MultiMediaCard (MMC) protocol, a Peripheral Component Interconnect (PCI) protocol, a PCI-Express (PCI-E) protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, an Integrated Drive Electronics (IDE) protocol, a private protocol, and so forth.

The memory interface 1140 interfaces with the semiconductor memory device 100. For example, the memory interface 1140 includes a NAND interface or a NOR interface.

The error correction block 1150 is configured to detect and correct errors of data received from the semiconductor memory device 100 using an error correcting code (ECC). The CPU 1120 may adjust a read voltage according to an error detection result of the error correction block 1150 and control the semiconductor memory device 100 in order to perform a re-read operation. For example, the error correction block 1150 may be provided as a component of the controller 1100.

The controller 1100 and the semiconductor memory device 100 may be integrated into one semiconductor device. For example, the controller 1100 and the semiconductor memory device 100 may be integrated into one semiconductor device and configure a memory card. Also, the controller 1100 and the semiconductor memory device 100 are integrated into one semiconductor device and may configure a memory card such as a personal computer (PC) card (Personal Computer Memory Card International Association (PCMCIA)), a Compact Flash (CF) card, a SmartMedia (SM) card (SMC), a Memory Stick, an MMC (reduced Size MMC (RS-MMC), MMCmicro), a Secure Digital (SD) card (miniSD, microSD, SD High Capacity (SDHC)), a Universal Flash Storage (UFS), and so on.

The controller 1100 and the semiconductor memory device 100 are integrated into one semiconductor device and may configure a solid state drive (SSD). The SSD includes a storage device configured to store data in a semiconductor memory. When the memory system 1000 is used as the SSD, an operation speed of the Host connected to the memory system 1000 may be enhanced.

For example, the memory system 1000 may be a component of an electronic device such as a computer, an ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for wirelessly sending and receiving information, at least one of various electronic devices configuring a home network, at least one of various electronic devices configuring a computer network, at least one of various electronic devices configuring a telematics network, an RFID device, at least one of various components configuring a computing system, and so forth.

The semiconductor memory device 100 or the memory system 1000 may be mounted using various packages. For example, the semiconductor memory device 100 or the memory system 1000 may be packaged utilizing a Package on Package (PoP), Ball grid arrays (BGAs), Chip scale packages (CSPs), a Plastic Leaded Chip Carrier (PLCC), a Plastic Dual In Line Package (PDIP), a Die in Waffle Pack, a Die in Wafer Form, a Chip On Board (COB), a Ceramic Dual In Line Package (CERDIP), a Plastic Metric Quad Flat Pack (MQFP), a Thin Quad Flatpack (TQFP), a Small Outline (SOIC), a Shrink Small Outline Package (SSOP), a Thin Small Outline (TSOP), a Thin Quad Flatpack (TQFP), a System In Package (SIP), a Multi Chip Package (MCP), a Wafer-level Fabricated Package (WFP), a Wafer-Level Processed Stack Package (WSP), and so forth.

Figure 8:
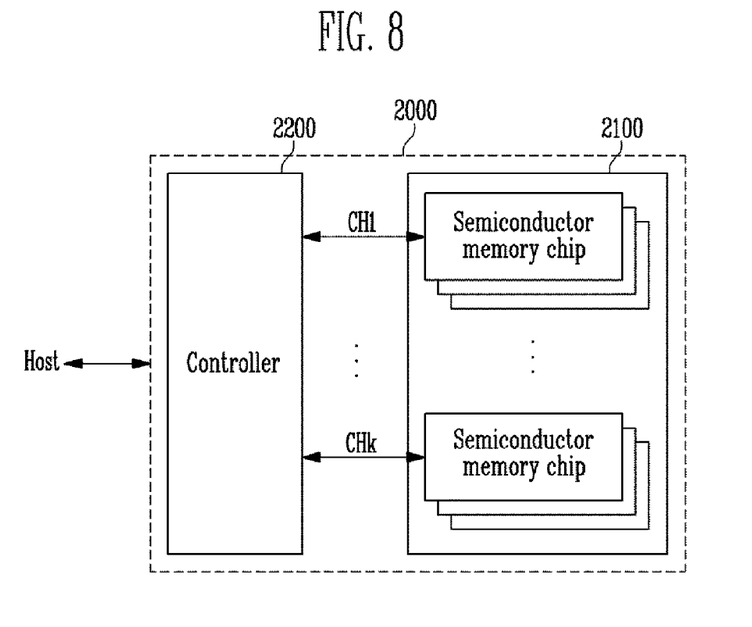
FIG. 8 is a block diagram of an application example of the memory system shown in FIG. 7.

FIG. 8 is a block diagram showing an application example of the memory system shown in FIG. 7.

Referring to FIG. 8, a memory system 2000 includes a semiconductor memory device 2100 and a controller 2200. The semiconductor memory device 2100 includes a plurality of semiconductor memory chips. The semiconductor memory chips are grouped, e.g., two or more semiconductor memory chips are grouped into a first group, two or more semiconductor memory chips are grouped into a second group, and so forth as shown in FIG. 8.

In FIG. 8, the plurality of groups communicate with the controller 2200 through first to kth channels CH1 to CHk.

Each semiconductor memory chip is configured to operate as the semiconductor memory device 100 described with reference to FIG. 1.

Each group is configured to communicate with the controller 2200 through one common channel. The controller 2200 is configured as the controller 1200 described with reference to FIG. 7 and configured to control the plurality of semiconductor memory chips of the semiconductor memory device 2100 through the plurality of channels CH1 to CHk.

Figure 9:
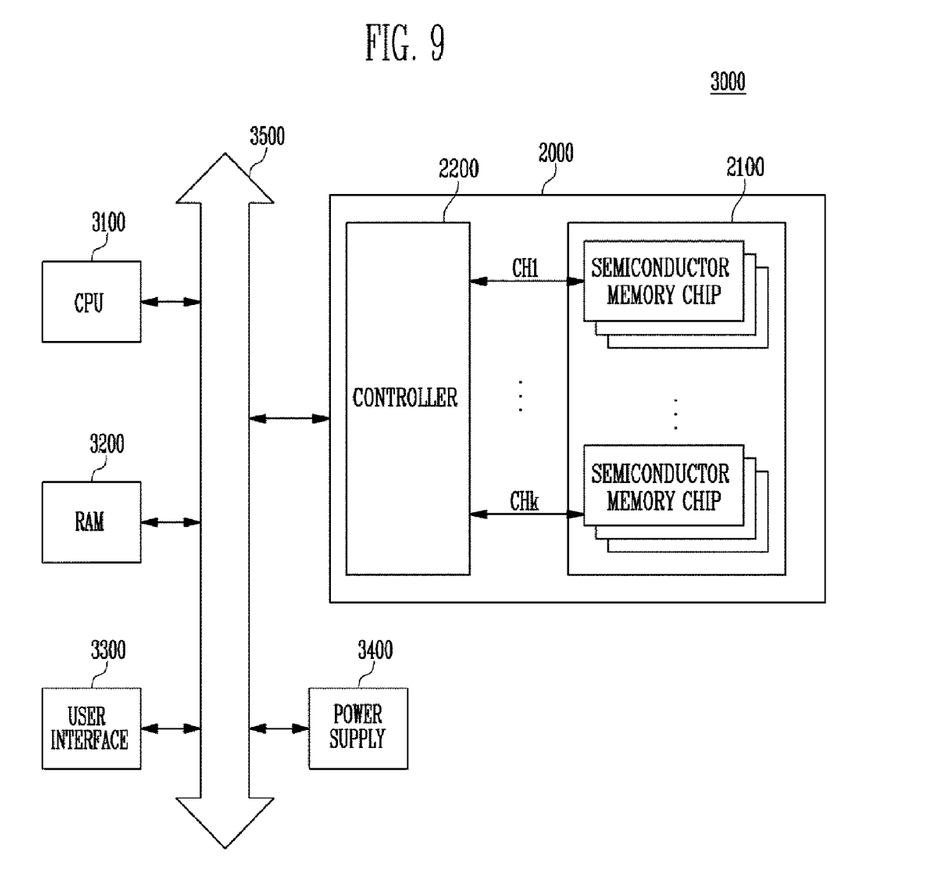
FIG. 9 is a block diagram showing a computing system including the memory system described with reference to FIG. 8.

FIG. 9 is a block diagram showing a computing system including the memory system described with reference to FIG. 8.

Referring to FIG. 9, a computing system 3000 includes a central processing unit 3100, a random access memory (RAM) 3200, a user interface 3300, a power 3400, a system bus 3500, and the memory system 2000.

The memory system 2000 is electrically connected to the central processing unit 3100, the RAM 3200, the user interface 3300, and the power 3400 through the system bus 3500. Data, which is provided through the user interface 3300 or processed by the central processing unit 3100 is stored in the memory system 2000.

In FIG. 9, the semiconductor memory device 2100 is shown to be connected to the system bus 3500 through the controller 2200. Alternatively, the semiconductor memory device 2100 may be configured to be directly connected to the system bus 3500. A function of the controller 2200 may be performed by the central processing unit 3100 and the RAM 3200.

In FIG. 9, the memory system 2000 described with reference to FIG. 8 is provided. However, the memory system 2000 may be replaced by the memory system 1000 described with reference to FIG. 7. For example, the computing system 3000 may be configured to include all of the memory systems 1000 and 2000 described with reference to FIGS. 7 and 8.

In an example, as a threshold voltage of a dummy memory cell can be increased before applying a program voltage in a 3-dimensional semiconductor memory device having the dummy memory cell, the leakage current characteristics of a memory cell array can be improved.

Relative terms that may have been used throughout the specification are only for the purposes of providing perspective or reference and are thus not otherwise limiting.

The above-disclosed subject matter is to be considered illustrative and not restrictive, and the appended claims are intended to cover all such physical orientations, modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the above detailed description.

What is claimed is:

1. A semiconductor memory device comprising:
a memory cell array including a string wherein the string comprises a first dummy memory cell and a second dummy memory cell, wherein the string comprises a drain select transistor, first and second drain side dummy memory cells, a plurality of memory cells, first and second source side dummy memory cells, and a source select transistor;
a circuit configured to provide a program voltage and one or more operation voltages to the string during a program operation; and
control logic configured to control the circuit to increase a first threshold voltage of the first dummy memory cell and to increase a second threshold voltage of the second dummy memory cell, wherein the circuit turns off the first drain side dummy memory cell and the first source side dummy memory cell adjacent to the plurality of memory cells and generates a gate-induced drain leakage current after channels of the string are precharged, wherein the first threshold voltage and a second threshold voltage increase by a hot carrier injection mechanism.

2. The semiconductor memory device of claim 1, wherein the circuit increases threshold voltages of the second drain side dummy memory cell adjacent to the drain select transistor and the second source side dummy memory cell adjacent to the source select transistor.

3. The semiconductor memory device of claim 1, wherein the circuit applies a pass voltage to the second drain side dummy memory cell adjacent to the drain select transistor and the second source side dummy memory cell adjacent to the source select transistor and flows a carrier by the gate-induced drain leakage current into charge storage layers of the second drain side dummy memory cell and the second source side dummy memory cell.

4. The semiconductor memory device of claim 3, wherein the circuit applies a first operation voltage to the plurality of memory cells when the pass voltage is applied to the second drain side dummy memory cell and the second source side dummy memory cell.

5. The semiconductor memory device of claim 4, wherein the circuit applies the pass voltage to the second drain side dummy memory cell and the second source side dummy memory cell and a second operation voltage to the first drain side dummy memory cell and the first source side dummy memory cell.

6. The semiconductor memory device of claim 5, wherein the first operation voltage is higher than the second operation voltage and lower than the pass voltage, and
the second operation voltage is a voltage configured to turn off the first drain side dummy memory cell and the first source side dummy memory cell.

7. The semiconductor memory device of claim 4, wherein the circuit applies an operation voltage so that the source select transistor is partially turned on when the second operation voltage is applied to the second drain side dummy memory cell and the second source side dummy memory cell.

8. The semiconductor memory device of claim 1, wherein the control logic controls circuits and performs a program operation of memory cells included in the string after the threshold voltages of the plurality of dummy memory cells increase.

9. A semiconductor memory device comprising:
a memory cell array including a string comprising a drain select transistor, a plurality of drain side dummy memory cells, a plurality of memory cells, a plurality of source side dummy memory cells, and a source select transistor; and
a circuit that applies an operation voltage to the string to increase a first threshold voltage and a second threshold voltage of one or more of the plurality of drain side dummy memory cells and one or more of the plurality of source side dummy memory cells, and programs a selected memory cell from among the plurality of memory cells,
wherein the circuit applies the operation voltage to turn off a first drain side dummy memory cell and a first source side dummy memory cell adjacent to the plurality of memory cells and generates a gate-induced drain leakage current.

10. The semiconductor memory device of claim 9, wherein the circuit increases the threshold voltages of one or more of the plurality of drain side dummy memory cells and one or more of the plurality of source side dummy memory cells by a hot carrier injection mechanism.

11. The semiconductor memory device of claim 9, wherein the circuit applies a pass voltage to a second drain side dummy memory cell adjacent to the drain select transistor and a second source side dummy memory cell adjacent to the source select transistor and flows a carrier by the gate-induced drain leakage into charge storage layers of the second drain side dummy memory cell and the second source side dummy memory cell.

12. The semiconductor memory device of claim 9, wherein the circuit applies the operation voltage to the first drain side dummy memory cell and the first source side dummy memory cell before a program voltage is applied to the selected memory cell.

13. The semiconductor memory device of claim 9, wherein the circuit applies a turn-on voltage to the drain select transistor and the source select transistor when the operation voltage is applied to the first drain side dummy memory cell and the first source side dummy memory cell.

14. A method comprising:
   precharging channels of a string, wherein the string comprises a drain select transistor, a source select transistor, a first drain side dummy memory cell, a second drain side dummy memory cell, a first source side dummy memory cell, a second source side dummy memory cell, and a plurality of memory cells,
   wherein a semiconductor memory device comprises the string;
   applying a turn-off voltage to the first drain side dummy memory cell and the first source side dummy memory cell;
   generating a gate-induced drain leakage;
   applying a pass voltage to the second drain side dummy memory cell while the first drain side dummy memory cell is in a turn-off state and to the second source side dummy memory cell while the first source side dummy memory cell is in the turn-off state;
   increasing threshold voltages of the second drain side dummy memory cell and the second source side dummy memory cell; and
   applying a program voltage to a selected memory cell from among the plurality of memory cells.

15. The operating method of claim 14, wherein a voltage lower than the pass voltage is applied to the plurality of memory cells when the pass voltage is applied.

16. The operating method of claim 14, wherein a turn-on voltage is applied to the drain select transistor and the source select transistor when the turn-off voltage is applied to the first drain side dummy memory cell and the first source side dummy memory cell.

17. The operating method of claim 14, wherein the increasing of the threshold voltages of the second drain side dummy memory cell and the second source side dummy memory cell is performed by a hot carrier injection mechanism.

* * * * *